(12) United States Patent
Williams et al.

(10) Patent No.: US 7,911,759 B2
(45) Date of Patent: Mar. 22, 2011

(54) METHODS AND ARRANGEMENT FOR PROTECTING AGAINST ELECTROSTATIC DISCHARGE

(75) Inventors: Gregory L. Williams, San Diego, CA (US); Kwanghyun David Choi, Irvine, CA (US)

(73) Assignee: Kyocera Corporation, Kyoto (JP)

( * ) Notice: Subject to any disclaimer, the term of this patent is extended or adjusted under 35 U.S.C. 154(b) by 340 days.

(21) Appl. No.: 12/189,188

(22) Filed: Aug. 10, 2008

(65) Prior Publication Data

US 2010/0033886 A1 Feb. 11, 2010

(51) Int. Cl.
*H02H 1/00* (2006.01)
*H02H 1/04* (2006.01)
*H02H 3/22* (2006.01)
*H05F 3/00* (2006.01)
*H05F 3/02* (2006.01)
*H02H 9/00* (2006.01)
*H04B 1/38* (2006.01)

(52) U.S. Cl. ............................ 361/212; 361/56; 455/566
(58) Field of Classification Search .................. 361/212, 361/56
See application file for complete search history.

(56) References Cited

U.S. PATENT DOCUMENTS

| 6,483,719 | B1 * | 11/2002 | Bachman | 361/816 |
| 6,728,555 | B1 * | 4/2004 | Pirila et al. | 455/566 |
| 2006/0055841 | A1 | 3/2006 | Keski-Opas | |

FOREIGN PATENT DOCUMENTS

DE    10 2006 040525 B3    4/2008

* cited by examiner

*Primary Examiner* — Jared Fureman
*Assistant Examiner* — Lucy Thomas

(57) ABSTRACT

An electronic device having ESD (Electrostatic Discharge) protection for a plurality of sides and including an external cover having at least one aperture and a plurality of slots disposed sufficiently close to a periphery of the at least one aperture. The electronic device further includes an ESD shield configured for providing ESD protection for a second side of an electronic device and also for the first side, the second side being opposite the first side. The ESD shield includes an ESD-shielding surface configured to provide the ESD protection for at least a portion of the second side, and a plurality of orthogonally protruding ESD shielding tabs, individual ones of the plurality of orthogonally protruding ESD shielding tabs configured to fit within respective ones of the plurality of slots when the ESD shield is mated with the external cover.

20 Claims, 6 Drawing Sheets

METHODS AND ARRANGEMENT FOR PROTECTING AGAINST ELECTROSTATIC DISCHARGE

FIELD OF THE INVENTION

The invention relates to Electrostatic Discharge (ESD) protection in electronic devices and techniques for implementing the same.

BACKGROUND

The Global Positioning System (GPS) has long been employed by the military to accurately determine the position of any given person or object around the globe. In the civilian arena, GPS-based applications have also proliferated. GPS positioning has been employed for purposes as diverse as navigation, farming, telecommunication, location-based marketing and advertising, etc.

Electronic devices, and more particularly portable electronic devices, are ubiquitous these days. For example, a typical consumer may carry at times an electronic key fob for opening/closing automobile doors, a cellular phone for communication, a portable music/video player for entertainment, etc.

Since these devices all contain tightly packed, highly sensitive electronic circuitry, electrostatic discharge (ESD) protection is an important consideration. Generally speaking, electrostatic discharge refers to static electricity discharge that can occur when the electronic device is exposed to a nearby object having a higher electrical potential (i.e., the ESD source). In the typical case, a spark between the object having the higher electrical potential and the electronic device may occur when so exposed. The discharge current path (of which the spark is a part) may traverse one or more sensitive circuits in the electronic device, causing a temporary or permanent malfunction.

Given the potential damage that ESD poses to modern electronic devices, many approaches have been proposed and implemented to protect electronic devices against ESD-related damage. A common approach is to provide certain circuits or components with ESD protection circuitry, such as discharge diodes, etc. Another common approach is to physically shield a portion or all of the vulnerable components with an ESD shield. Other approaches have also been proposed and/or implemented.

Generally speaking, an ESD shield is a conductive shield that presents to the ESD source a lower resistance path to ground. The discharge current that emanates from the ESD source is then diverted onto the ESD shield, thereby preventing the discharge current from causing damage to the sensitive electronic components.

In a typical device, there is typically a conductive or insulative housing or cover that acts as an environmental enclosure and also provides a pleasing cosmetic appearance. For example, a typical cellular phone may be encased in a plastic or aluminum housing that provides a mounting framework for the electronic components therein as well as protects the electronic components from environmental damage.

ESD current typically cannot penetrate the conductive or insulative housing material. Instead, ESD current penetrates the electronic device through joints or interfaces where the housing parts are assembled together. In an example cellular phone, there may be two half shells that form the housing. The joint between these two shells are often vulnerable to ESD current penetration and is often the focus for ESD protection. If one of the shells has other openings, such as an opening to accommodate a battery or a LCD (Liquid Crystal Display) sub-assembly, the opening edges are also vulnerable to ESD current penetration.

If there are multiple joints and openings in a given housing, one approach to ESD protection is to provide an ESD shield at any location where ESD current penetration may occur. However, this approach also increases the mass and thickness of the resultant electronic device. Given the trend toward device miniaturization and the need to pack more functionality and capability into each device (which necessitates an ever-increasing number of circuits packed into an ever-shrinking form factor), engineers are constantly looking for ways to maintain or improve ESD protection while eliminating bulk and materials from the finished product. Further, to maximize market appeal, the finished product has to be aesthetically pleasing. ESD protection schemes must therefore also take aesthetic into consideration. Improving ESD protection while minimizing bulk and maintaining a pleasing aesthetic appearance is a subject of the present invention.

SUMMARY

The invention relates, in an embodiment, to an electronic device having ESD (Electrostatic Discharge) protection for a plurality of sides of the electronic device. The electronic device includes an external cover configured to externally cover a first side of the electronic device, the external cover having at least one aperture and a plurality of slots disposed sufficiently close to a periphery of the at least one aperture such that ESD current is diverted to material disposed in at least one of the plurality of slots if the ESD current penetrates a gap that exists at the at least one aperture. The electronic device further includes an ESD shield configured for providing ESD protection for a second side of an electronic device and also for the first side, the second side being opposite the first side. The ESD shield includes an ESD-shielding surface configured to provide the ESD protection for at least a portion of the second side, and a plurality of orthogonally protruding ESD shielding tabs, individual ones of the plurality of orthogonally protruding ESD shielding tabs configured to fit within respective ones of the plurality of slots when the ESD shield is mated with the external cover.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1A:
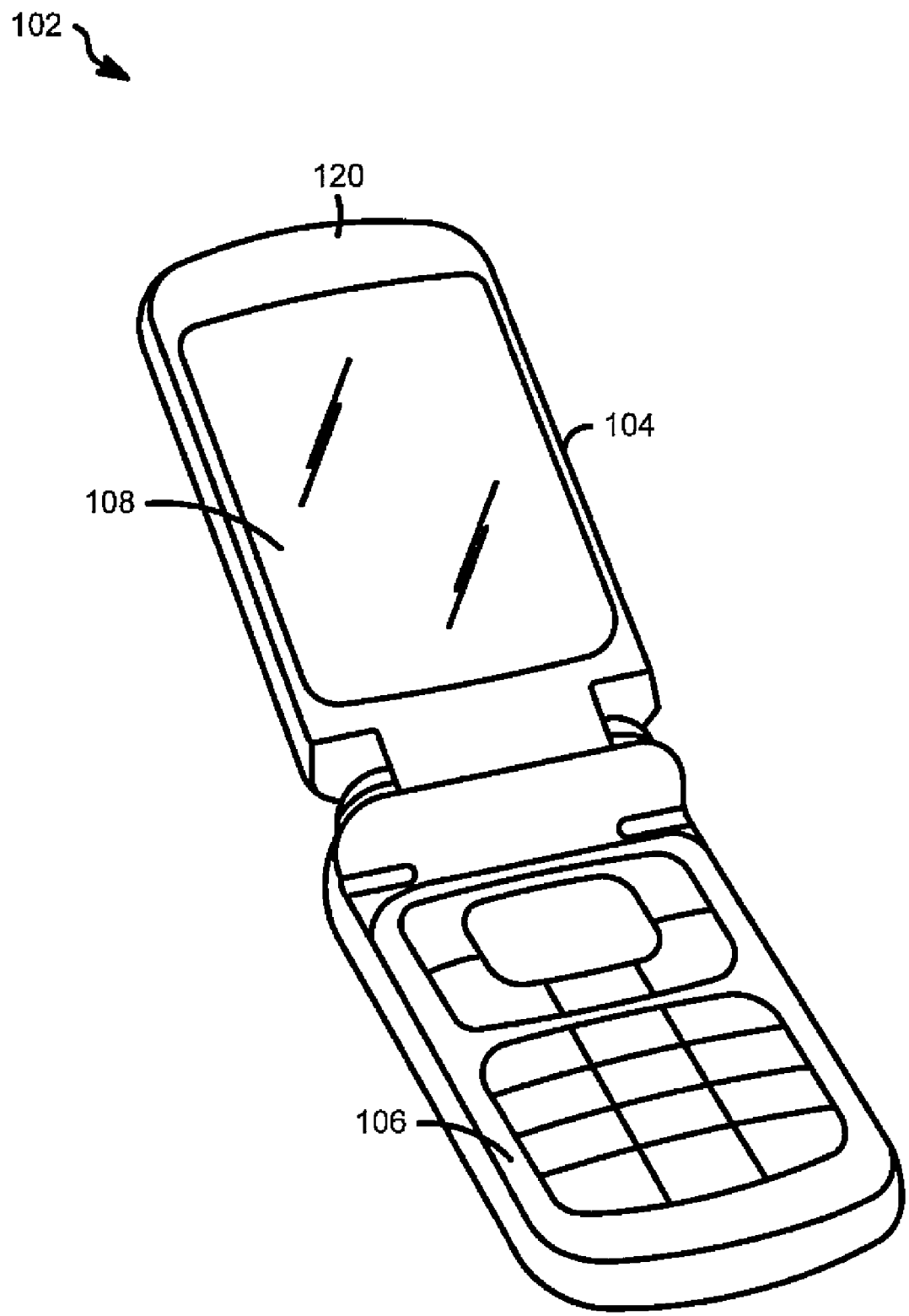
FIGS. 1A, 1B and 1C show a flip-out cellular phone

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to an ESD protection arrangement for protecting multiple sides of a given electronic device. In an embodiment an electrically conductive frame having an ESD-shielding surface and integrated but orthogonally protruding ESD-shielding walls and/or tabs is provided to provide ESD protection. The ESD-shielding surface is configured to protect ESD-sensitive devices that are disposed behind the ESD-shielding surface. The orthogonally protruding ESD-shielding walls and/or tabs are configured to extend ESD protection to one or more other sides of the device.

In an example, a cellular phone may be formed of two main portions. The two main portions may be housed in two separate housings that are pivotally connected with one another. Such a cellular phone design may be referred to commonly as a clam-shell or slide-out or flip-out design, wherein one part of the cellular phone may house a portion of the circuitry and/or the keypad and the other part may house the display(s). Although the invention is not limited to clam-shell cellular phones or the display-containing portion of the cellular phone, the display-containing portion, and particularly a display-containing portion having at least two LCD panels, will be used to facilitate discussion of relevant details of the invention.

In one or more embodiments, the display-containing portion may include a housing having a plurality of apertures to allow the user to view one or more displays. An ESD shield may be provided wherein the ESD-shielding surface is configured to protect one side of the display-containing portion and the orthogonally protruding ESD-shielding walls and/or tabs may be configured to protect the edges as well as the opposite side. In this manner, a single ESD shield may protect two or more sides of the electronic device while requiring minimal additional bulk or adding minimal, if any, additional thickness to the finished product. Advantageously, the orthogonally protruding ESD-shielding tabs may be hidden in slots in the housing in order preserve the aesthetically pleasing look of the finished product.

Figure 1B:
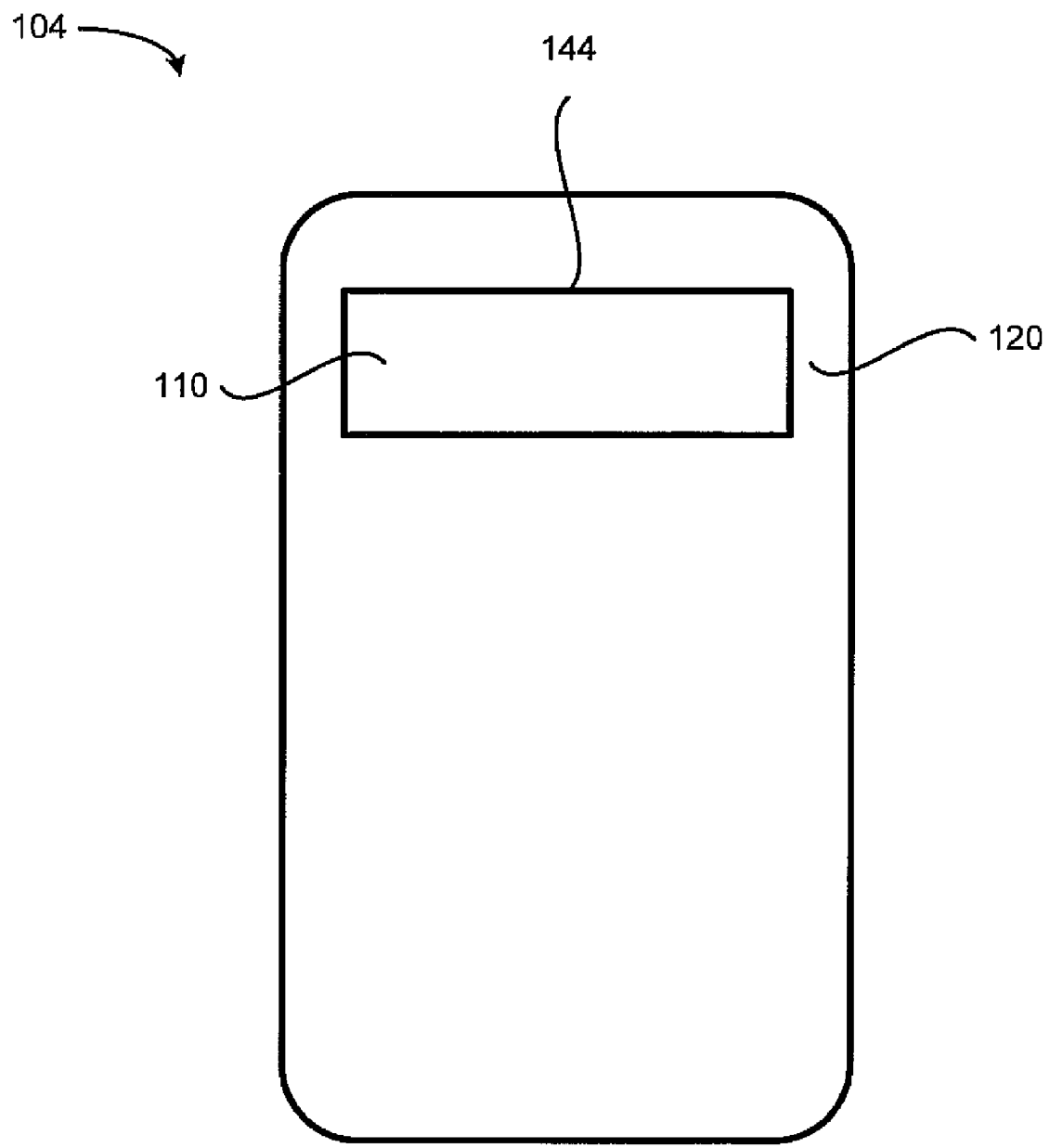
Figure 1C:
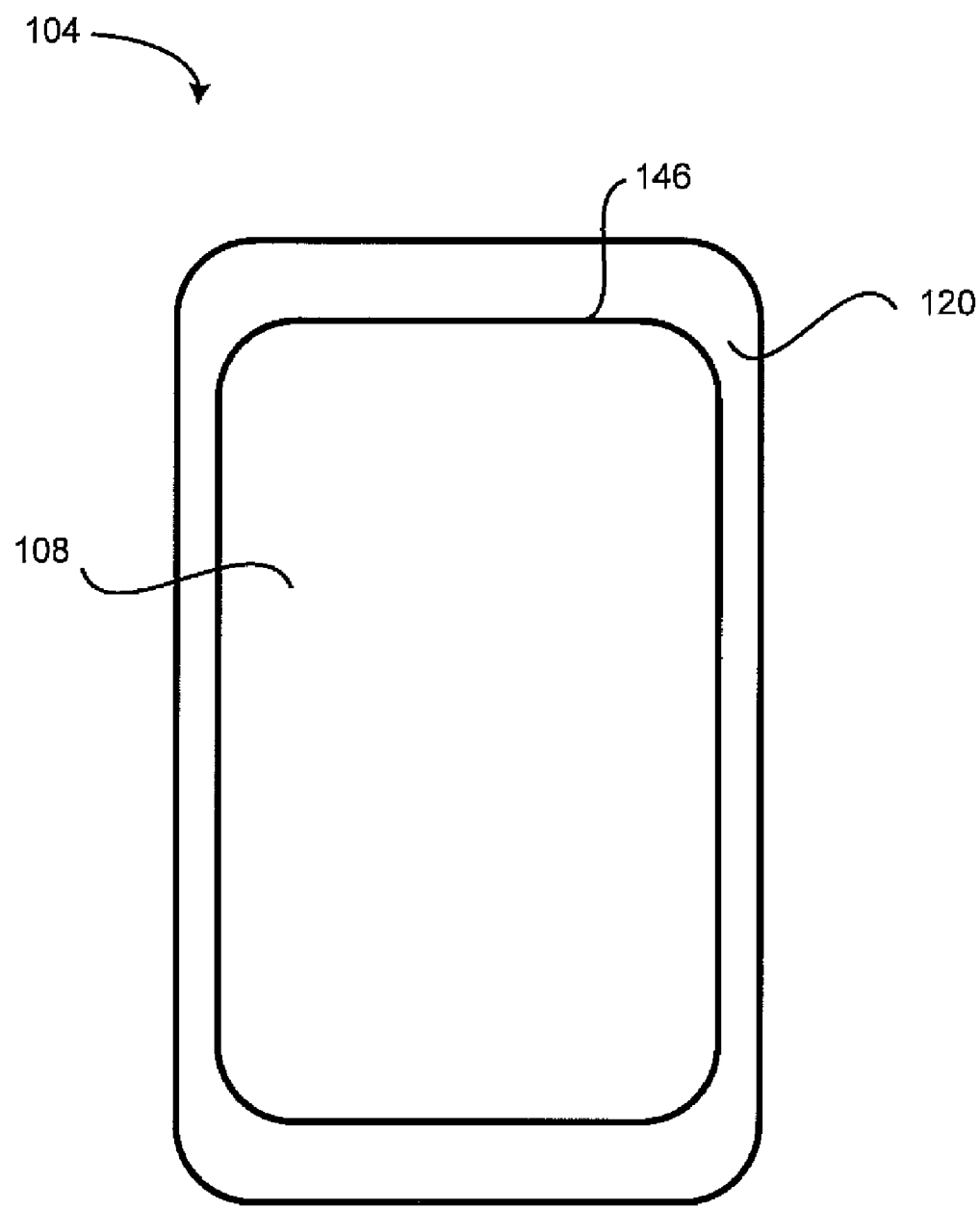

The features and advantages of the present invention may be better understood with reference to the figures and discussions that follow. FIGS. 1A, 1B and 1C show a flip-out cellular phone 102 having a first portion 104 and a second portion 106, both of which are enclosed in their own housings and are pivotally connected with one another. First portion 104 represents the display-containing portion and includes a housing 120 having two apertures for accommodating two LCDs 108 (FIG. 1C) and 110 (FIG. 1B). In the example of FIGS. 1A, 1B, and 1C, LCD 108 is intended to be viewed from the front side of housing 120 and LCD 110 is intended to be viewed from opposite side (backside) of housing 120. These two LCDs are shown in the front view and back view of first portion 104 in FIG. 1C and FIG. 1B respectively. Thus, apertures are provided in opposite sides of housing 120 to accommodate LCDs 108 and 110.

Each of LCDs 108 and 110 is covered with an LCD lens to protect the LCD circuitry from environmental damage. Generally speaking, housing 120 is formed of a conductive or insulative material (such as aluminum or plastic). If housing 120 is a metallic housing, and a path to ground is not already provided with housing 120, the inventive ESD protection arrangement is particularly useful. ESD current tends not to be able to penetrate the housing material, thus rendering electronic devices housed therein relatively safe from ESD-related damage. Likewise, ESD current tends to not be able to penetrate the material that forms the LCD lens (such as transparent polycarbonate material). Accordingly, electronic components protected by the LCD lens are also relatively safe from ESD-related damage.

Areas vulnerable to ESD-related damage include the edge of the apertures formed in housing 120 to accommodate LCDs 108 and 110. If these edges (144 and 146) are inadequately protected, ESD current may be able to reach sensitive electronic components within display-containing portion 104, rendering those sensitive electronic components temporarily or permanently damaged. If housing 120 is formed of multiple pieces that snap or are fastened together, similar vulnerability exists with respect to the joints where the housing pieces mate together.

Figure 2:
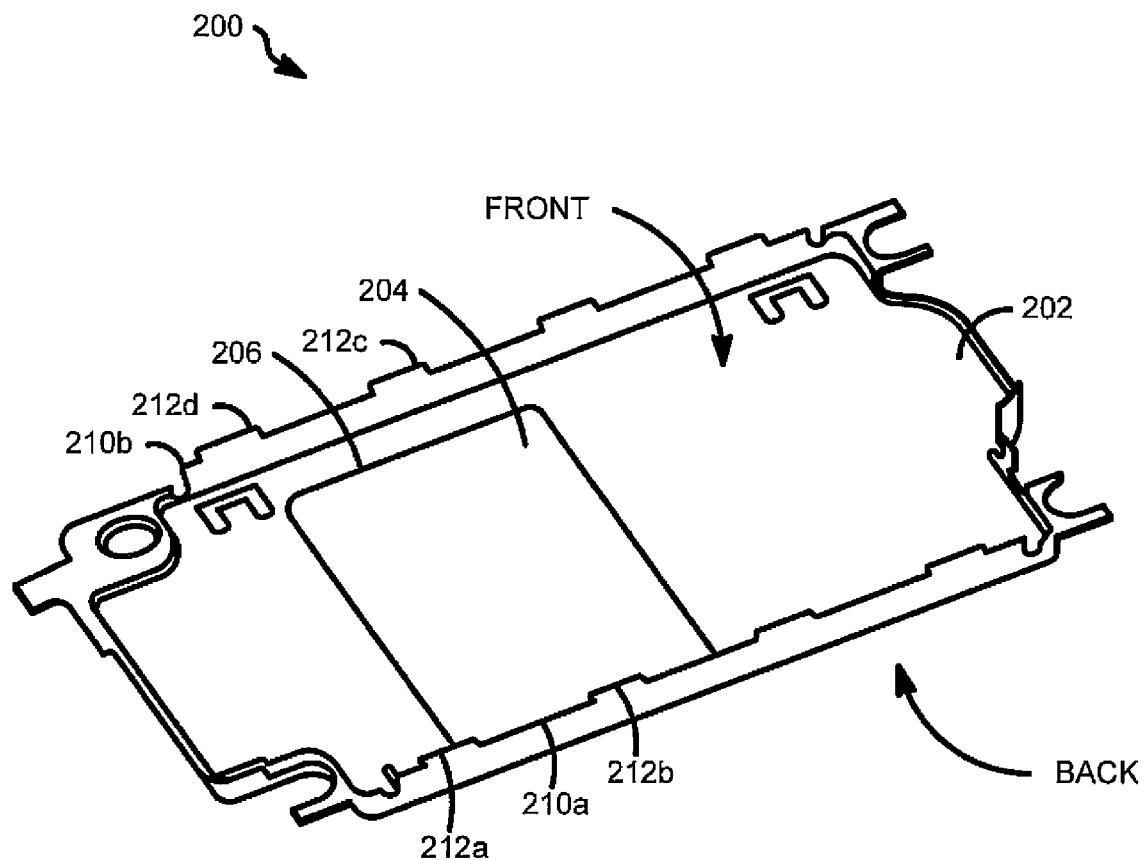
FIG. 2 shows, in accordance with one or more embodiments of the present invention, an ESD shield 200 having an ESD-shielding surface 202 and integrated ESD shielding walls and/or tabs.

FIG. 2 shows, in accordance with one or more embodiments of the present invention, an ESD shield 200 having an ESD-shielding surface 202 and integrated ESD shielding walls and/or tabs. ESD shield 200 may be formed of a conductive material, such as metal or metallized plastic, in order to present a low resistance path to ground for the purpose of providing ESD protection.

ESD shield 200 has an aperture 204, the edge of which is configured to surround a LCD panel that projects light/text/images in the direction into the page of FIG. 2 (front to back direction in FIG. 2). The edge 206 of aperture 204, being in close proximity to the edge of the LCD panel, presents a low resistance path to ground to divert damaging ESD current from penetrating into the device through the gap between the LCD panel edge and edge 206 of ESD shield 200.

Since ESD current cannot penetrate the material of ESD shield 200 nor the LCD cover material, the protection of the edge where the LCD panel and ESD shield 200 meet up renders the back side of the device substantially invulnerable to ESD-related damage.

Figure 3:
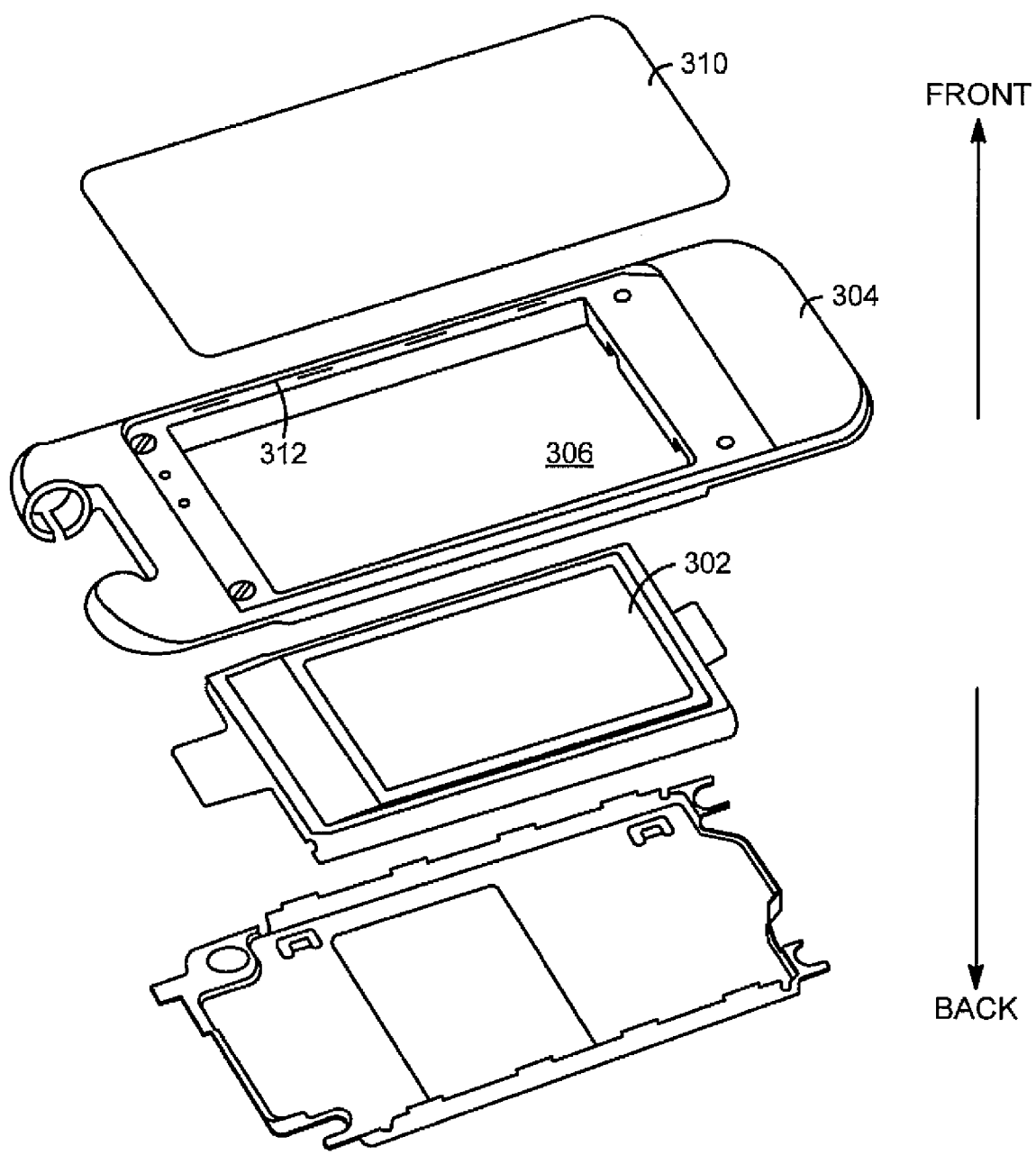
FIG. 3 shows, in accordance with one or more embodiments of the present invention, an exploded view of the LCD-containing subsystem of an example flip-out cellular phone, including the inventive ESD shield.

In the example of FIGS. 2 and 3, ESD shield 200 also functions as a back portion of the housing to enclose circuit 302. The other portion of the housing is shown in FIG. 3 as front cover 304, which may be formed of a material (such as a metal or plastic) that can provide both environmental and ESD protection to circuit 302. Front cover 304 is configured as an external cover to cover the front side of the electronic device, in one or more embodiments.

ESD shield 200 may include, in an embodiment, raised walls 210a and 210b, which protrude orthogonally from ESD shielding surface 202. Walls 210a and 210b provide ESD protection for the edge of the device by presenting a low resistance path to ground, thereby preventing ESD current from being able to penetrate into the electronic device through the side of the device. Walls 210a and 210b may be extended to wrap around most or all of the periphery of ESD shield 200 to provide ESD protection from all around the edge. Walls 210a and 210b may be varied in height at various locations to accommodate different designs, if desired.

Up to now, the discussion has centered on ESD protection for the back side of the device and the edge of the device. The front side of the device is protected primarily by the material of front cover 304 of the housing, as mentioned earlier. Front cover 304 has an aperture 306 for accommodating a LCD display (front of circuit 302) to allow the LCD display to project light text image toward the front of the device. A LCD lens 310 covers the LCD panel and provides environmental as well as ESD protection for the LCD panel circuitry. Since the ESD current cannot penetrate the material of front cover 304 or the material of the LCD lens (which may be made of, for example, polycarbonate), the edge 312 where LCD lens 310 meets with the edge of aperture 306 represents one of the remaining areas vulnerable to ESC current penetration.

In accordance with one or more embodiments, orthogonally protruding ESD-shielding tabs, which are orthogonal to ESD-shielding surface 202, are provided with ESD shield 200 to facilitate insertion into slots built into front cover 304 of the device housing. Four of these ESD shielding tabs may be seen as tabs 212a, 212b, 212c, and 212d. Although 8 ESD shielding tabs are shown, the number of ESD shielding tabs may vary as desired. The dimension of each ESD-shielding tab may also be varied as desired and all ESD-shielding tabs may have the same size and height or different ESD-shielding tabs may have different sizes and/or different heights.

Figure 4:
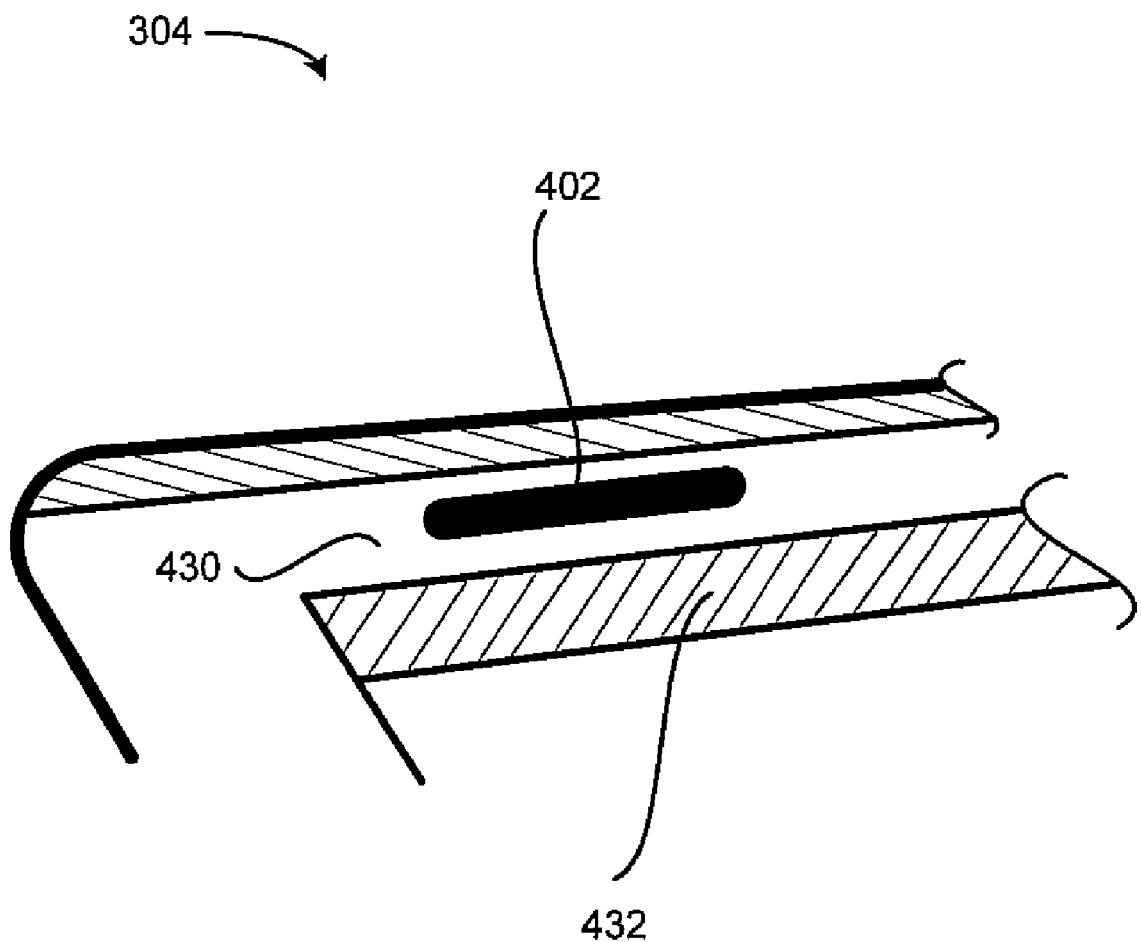
FIG. 4 shows, in accordance with one or more embodiments of the present invention, an enlarged view of a slot 402 configured to accommodate one of the ESD-shielding tabs.

FIG. 4 shows, in accordance with one or more embodiments, an enlarged view of a slot 402 configured to accommodate one of the ESD-shielding tabs. When ESD shield 200 is mated with front cover 304 (of FIG. 3), a ESD-shielding tab is inserted (from the backside) into slot 402 such that at least some of the ESD-shielding material of ESD shield 200 is present to ESD current that attempts to penetrate the gap between front cover 304 and LCD lens 310. Generally speaking, slot 402 (and one or more other slots) is/are disclosed sufficiently close to a periphery of the aperture formed in front cover 304 such that ESD current is diverted to the tab disposed in slot 402 (or one or more other slots) if the ESD current attempts to penetrate the front cover gap around the aperture. One skilled in the art can readily appreciate that such distance may vary from device to device yet there is a definite and determinable distance in each device whereby if the slots are placed further from the gap where ESD protection is desired than such distance, ESD protection will be ineffective.

In an embodiment, the ESD-shielding tab may rest slightly protruded out of slot 402 after front cover 304 and ESD shield 200 are mated together. In an embodiment the ESD-shielding tab may rest flushed with slot 402 after front cover 304 and ESD shield 200 are mated together. In an embodiment, the ESD-shielding tab may rest slightly recessed with respect to slot 402 after front cover 304 and ESD shield 200 are mated together. Front cover 304 typically has sufficient slots to accommodate all ESD-shielding tabs.

In one or more embodiments, slot 402 is slightly inward of the outside edge of the electronic device. In an embodiment, slot 402 is formed on an internal shelf 430 that is invisible from outside the finished device when looking at the device from the edge. In this manner, when front cover 304 and ESD shield 200 are mated together, the ESD-shielding tabs may be invisible from the edge since they are inserted into their slots and only walls 210a and 210b may be visible from the edge of the device.

Internal shelf 430 represents a shelf also for supporting LCD lens 310 to allow the LCD and the LCD lens 310 to achieve a more flushed appearance with respect to front cover 304 when LCD lens 310 is fitted into the aperture of front cover 304. Internal shelf 430 is supported by a wall 432, which may also provide some degree of mechanical support and alignment for walls 210a and 210b of ESD shield 200 when front cover 304 and ESD shield 200 are mated together. A downwardly extending partial wall or lip may be provided with front cover 304 to overlap and visually cover the joint between wall 210a/210b and front cover 304 if desired. Material left in between adjacent slots provides mechanical strength to internal shelf 430 and front cover 304 as a whole. LCD lens 310 covers the slots (and the ESD-shielding tabs in the slots) when LCD lens 310 is disposed on inner shelf 430 in the finished product.

With respect to ESD protection, the presence of the ESD-shielding material (such as metal or a metallized plastic of the ESD shield) of the tab in slot 402 presents a low resistance path to ground for any ESD current attempting to penetrate the gap between front cover 304 and LCD lens 310. Any ESD current attempting to penetrate the gap between front cover 304 and LCD lens 310 would be diverted to one of the ESD shielding tabs and harmless conducted to ground. As discussed, the materials of front cover 304 and LCD lens 310 already provide ESD protection for most of the front side of the electronic device. By providing the ESD-shielding tabs, which are integrally formed with the ESD shield that protects the backside and the edge of the device, the remaining vulnerable area of the front side of the device (e.g., the gap between front cover 304 and LCD lens 310) is also protected.

As can be appreciated from the foregoing, the innovative ESD shielding arrangement provides protection for the back side, the edge, and the front side of the electronic device with a single ESD shield. The thickness of the device is not adversely affected since the slots are formed on an internal shelf that already exists to support the LCD lens. There is no need to provide a layer of ESD-protection material parallel to the plane of the front cover for ESD protection purpose. Accordingly, the thickness of the finished product is not increased by the addition of such an additional layer of ESD protection material. Aesthetically speaking, the ESD-shielding tabs are hidden from view from the side after assembly (by being hidden in the slots) and also invisible from the top after assembly (by being covered with the LCD lens). Accordingly, improved ESD protection is achieved without incurring significant penalty in device thickness or in aesthetic.

A portion of the ESD shield may be formed of a non-conductive material as long as the ESD shielding tabs are formed of a conductive material and there is a path from the ESD shielding tabs to ground for diverting ESD current. Although the discussion employs a portion of a cellular phone to facilitate discussion, the ESD shielding arrangement and technique may be applicable to any portion or the whole of any electronic device, irrespective whether the electronic device is intended to be stationary or portable, when ESD protection from multiple sides is desired.

While this invention has been described in terms of several preferred embodiments, there are alterations, permutations, and equivalents, which fall within the scope of this invention. Although various examples are provided herein, it is intended that these examples be illustrative and not limiting with respect to the invention. For example, a portion of the ESD shield may be formed of a non-conductive material as long as the ESD shielding tabs are formed of a conductive material, and there is a path from the ESD shielding tabs to ground for diverting ESD current. As another example, although the discussion employs a portion of a cellular phone to facilitate discussion, the ESD shielding arrangement and technique may be applicable to any portion or the whole of any electronic device, irrespective whether the electronic device is intended to be stationary or portable, when ESD protection from multiple sides is desired.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An electronic device having ESD (Electrostatic Discharge) protection for a plurality of sides of said electronic device, comprising:
    an external cover configured to externally cover a first side of said electronic device, said external cover having
        at least one aperture, and
        a plurality of slots disposed sufficiently close to a periphery of said at least one aperture such that ESD current is diverted to material disposed in at least one of said plurality of slots if said ESD current penetrates a gap that exists at said at least one aperture; and
    an ESD shield configured for providing ESD protection for a second side of the electronic device and also for said first side, said second side being opposite said first side, said ESD shield including
        an ESD-shielding surface configured to provide said ESD protection for at least a portion of said second side, and
        a plurality of orthogonally protruding ESD shielding tabs, which are orthogonal to the ESD-shielding surface, individual ones of said plurality of orthogonally protruding ESD shielding tabs configured to fit within respective ones of said plurality of slots when said ESD shield is mated with said external cover.

2. The electronic device of claim 1 wherein said electronic device represents a cellular phone.

3. The electronic device of claim 1 wherein said plurality of orthogonally protruding ESD-shielding tabs are configured to protrude above a surface where slot openings of said plurality of slots are located.

4. The electronic device of claim 1 wherein said plurality of orthogonally protruding ESD-shielding tabs are configured to protrude below a surface where slot openings of said plurality of slots are located.

5. The electronic device of claim 1 wherein said plurality of orthogonally protruding ESD-shielding tabs are configured to be flush a surface where slot openings of said plurality of slots are located.

6. The electronic device of claim 1 wherein said plurality of orthogonally protruding ESD-shielding tabs are configured to be invisible from outside of said electronic device after said ESD shield is mated with said external cover.

7. The electronic device of claim 1 wherein said plurality of orthogonally protruding ESD shielding tabs are made of a metal.

8. The electronic device of claim 1 wherein said at least one aperture is configured for implementing a LCD (Liquid Crystal Display) panel.

9. The electronic device of claim 8 wherein said plurality of slots are disposed on a shelf integrated with said external cover, said shelf being configured to accommodate at least a lens for said LCD panel such that said lens is more flush with a surface of said external cover after being disposed on said shelf when compared with a situation wherein another lens is disposed on said surface of said external cover.

10. An ESD (Electrostatic Discharge) shield configured for providing ESD protection for a plurality of sides of said electronic device, said electronic device also having an external cover configured to externally cover a first side of said plurality of sides of said electronic device, said external cover having at least one aperture and a plurality of slots, comprising:
    an ESD-shielding surface configured to provide said ESD protection for at least a portion of a second side of said plurality of sides of said electronic device, said second side being opposite said first side, and
    a plurality of orthogonally protruding ESD shielding tabs, which are orthogonal to the ESD-shielding surface, individual ones of said orthogonally protruding ESD shielding tabs configured to fit within respective ones of said plurality of slots formed in said external cover when said ESD shield is mated with said external cover, wherein said at least one of said plurality of orthogonally protruding ESD shielding tabs is disposed sufficiently close to a periphery of said at least one aperture such that ESD current is diverted to material disposed to said at least one of said plurality of ESD shielding tabs if said ESD current penetrates a gap that exists at an opening of said at least one aperture and wherein circuitry being protected from said ESD is disposed between said external cover and said ESD shield.

11. The electronic device of claim 10 wherein said electronic device represents a cellular phone.

12. The ESD shield of claim 10 wherein said plurality of orthogonally protruding ESD-shielding tabs are configured to protrude above a surface where slot openings of said plurality of slots are located.

13. The ESD shield of claim 10 wherein said plurality of orthogonally protruding ESD-shielding tabs are configured to be flush a surface where slot openings of said plurality of slots are located.

14. The ESD shield of claim 10 wherein said plurality of orthogonally protruding ESD-shielding tabs are configured to be invisible from outside of said electronic device after said ESD shield is mated with said external cover.

15. The ESD shield of claim 10 wherein said plurality of orthogonally protruding ESD shielding tabs are made of a metal.

16. The ESD shield of claim 10 wherein said at least one aperture is configured for implementing a LCD (Liquid Crystal Display) panel.

17. The ESD shield of claim 16 wherein said plurality of slots are disposed on a shelf integrated with said external cover, said shelf being configured to accommodate at least a lens for said LCD panel such that said lens is more flush with a surface of said external cover after being disposed on said shelf when compared with a situation wherein another lens is disposed on said surface of said external cover.

18. A method for protecting multiple sides of an electronic device against ESD (Electrostatic Discharge) damage, comprising:
providing an external cover configured to externally cover a first side of said electronic device, said external cover having
at least one aperture, and
a plurality of slots disposed sufficiently close to a periphery of said at least one aperture such that ESD current is diverted to material disposed in at least one of said plurality of slots if said ESD current penetrates a gap that exists at said at least one aperture;
providing an ESD shield configured for providing ESD protection for a second side of an electronic device and also for said first side, said second side being opposite said first side, said ESD shield including
an ESD-shielding surface configured to provide said ESD protection for at least a portion of said second side, and
a plurality of orthogonally protruding ESD shielding tabs, which are orthogonal to the ESD-shielding surface, individual ones of said plurality of orthogonally protruding ESD shielding tabs configured to fit within respective ones of said plurality of slots when said ESD shield is mated with said external cover; and
mating said external cover and said ESD shield by fitting said plurality of orthogonally protruding ESD shielding tabs into said respective ones of said plurality of slots such that circuitry to be protected against said ESD damage is disposed between said external cover and said ESD shield.

19. The method of claim 18 wherein said electronic device represents a cellular phone.

20. The method of claim 18 wherein said plurality of orthogonally protruding ESD-shielding tabs are configured to be invisible from outside of said electronic device after said ESD shield is mated with said external cover.

* * * * *